(12) United States Patent
Seo

(10) Patent No.: US 11,493,561 B2
(45) Date of Patent: Nov. 8, 2022

(54) METHOD FOR PRODUCING SENSOR AND BATTERY PRESSURE DETECTING SENSOR PRODUCED THEREBY

(71) Applicant: AMOGREENTECH CO., LTD., Gimpo-si (KR)

(72) Inventor: Inyong Seo, Seoul (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 17/292,328

(22) PCT Filed: Oct. 28, 2019

(86) PCT No.: PCT/KR2019/014307
§ 371 (c)(1),
(2) Date: May 7, 2021

(87) PCT Pub. No.: WO2020/096252
PCT Pub. Date: May 14, 2020

(65) Prior Publication Data
US 2021/0396814 A1 Dec. 23, 2021

(30) Foreign Application Priority Data
Nov. 9, 2018 (KR) .................. 10-2018-0137561

(51) Int. Cl.
| | |
|---|---|
| *G01R 31/385* | (2019.01) |
| *H01M 10/48* | (2006.01) |
| *G01R 31/364* | (2019.01) |
| *G01R 31/378* | (2019.01) |

(52) U.S. Cl.
CPC ......... *G01R 31/385* (2019.01); *G01R 31/364* (2019.01); *H01M 10/48* (2013.01); *G01R 31/378* (2019.01); *H01M 2200/20* (2013.01)

(58) Field of Classification Search
CPC .. G01R 31/385; G01R 31/364; G01R 31/378; H01M 10/48; H01M 2200/20
USPC ................................. 324/425–434
See application file for complete search history.

(56) References Cited

U.S. PATENT DOCUMENTS

2017/0098871 A1   4/2017   Fukuda et al.

FOREIGN PATENT DOCUMENTS

| JP | 200307539 A | * | 9/2001 | .......... G01N 27/409 |
|---|---|---|---|---|
| JP | 2009-076265 A | | 4/2009 | |
| KR | 10-2014-0035206 A | | 3/2014 | |
| KR | 10-2015-0012793 A | | 2/2015 | |
| KR | 20170133699 A | * | 12/2017 | .......... H01L 23/481 |
| KR | 10-2018-0117894 A | | 10/2018 | |

* cited by examiner

*Primary Examiner* — Melissa J Koval
*Assistant Examiner* — Trung Q Nguyen
(74) *Attorney, Agent, or Firm* — Maschoff Brennan

(57) ABSTRACT

Disclosed is a method for producing a sensor and a battery pressure detecting sensor produced thereby, which operate in a short mode when a pressure of a standard level or more is applied, thereby preventing the breakage and ignition of a battery due to swelling. The disclosed battery pressure detecting sensor disposes a membrane sheet formed with a first accommodation hole under a conductive sheet, has a part of the conductive sheet connected to a first terminal through a first accommodation hole, and has the membrane sheet connected to a second terminal.

20 Claims, 11 Drawing Sheets

[FIG. 1]
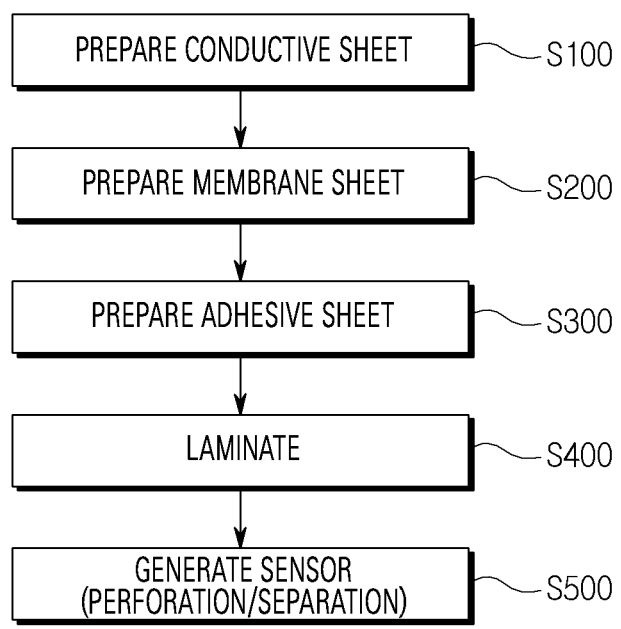

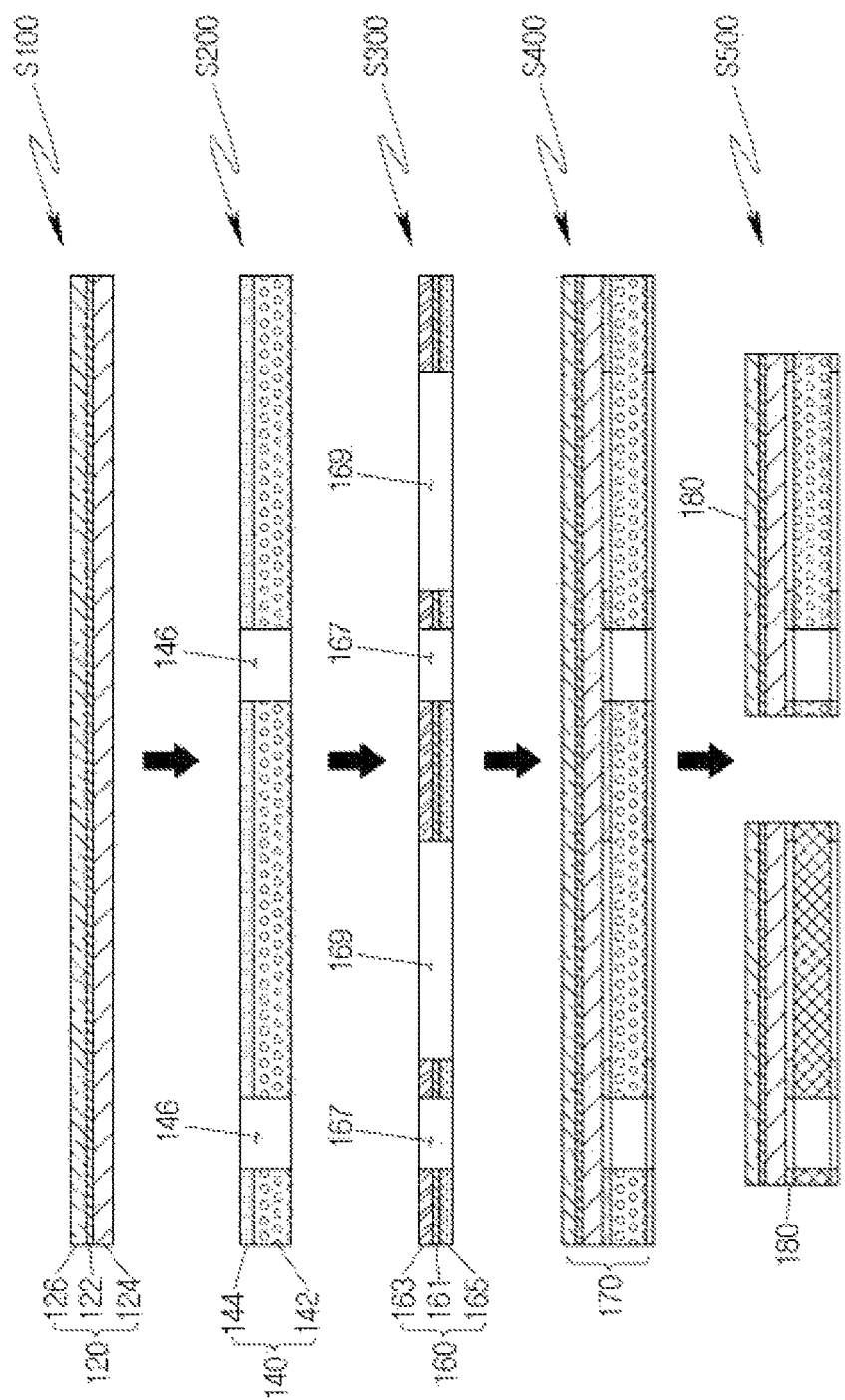

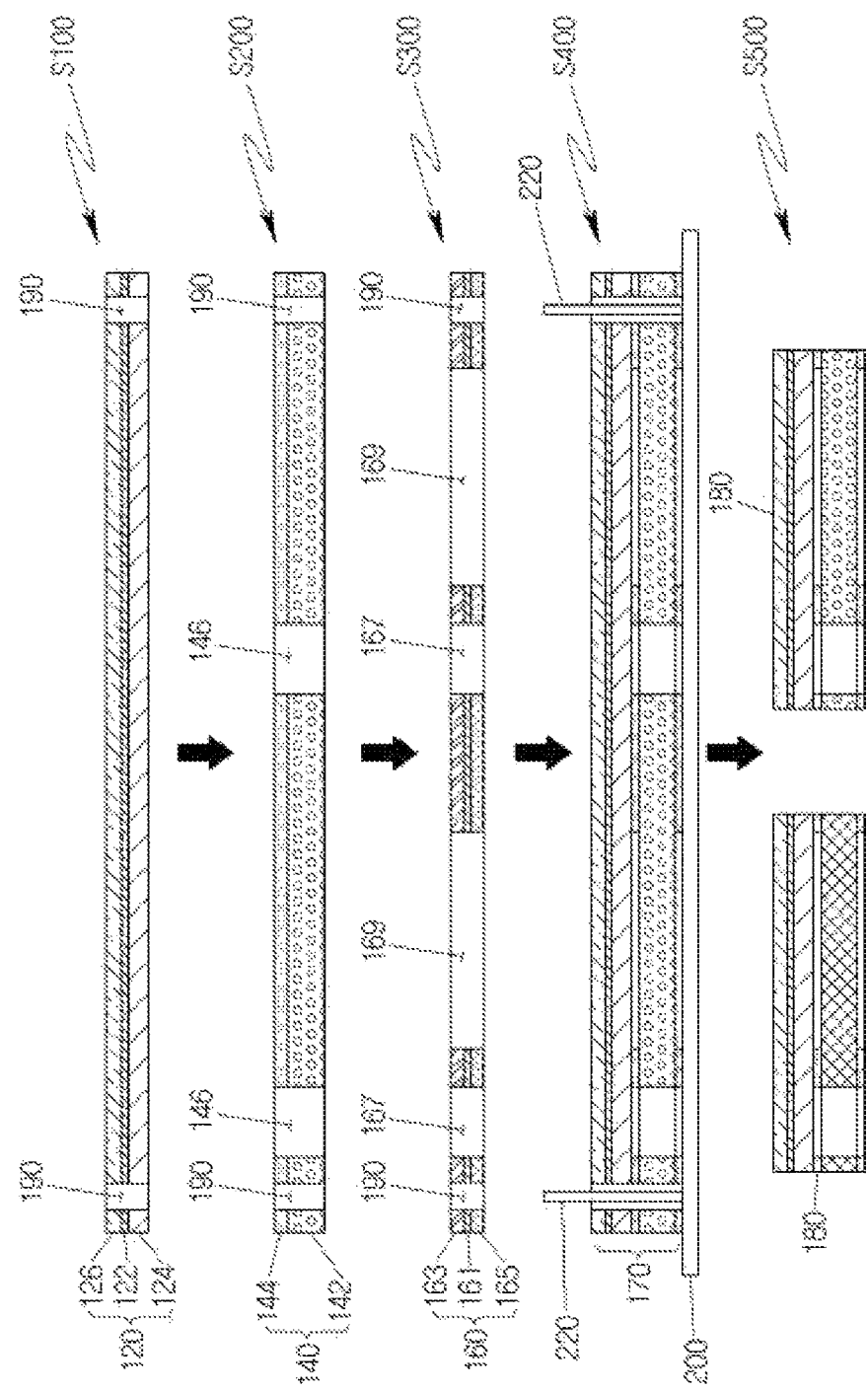
[FIG. 3]

[FIG. 4]
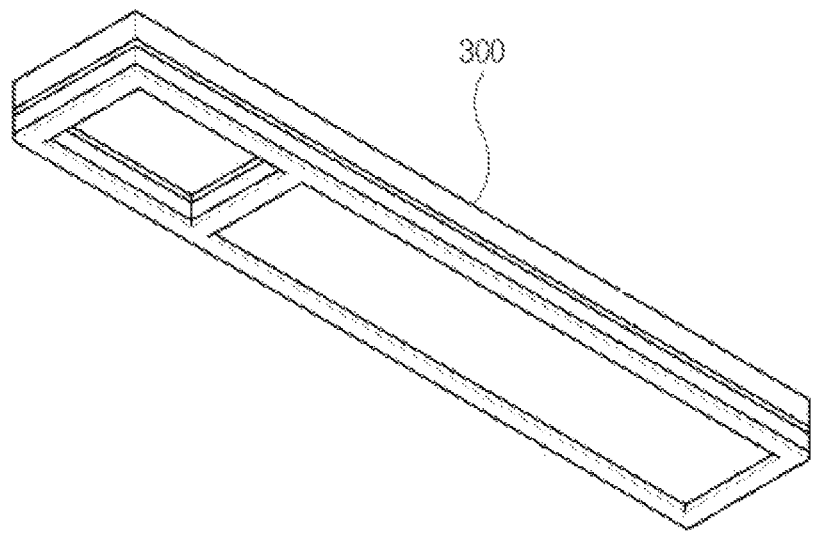

[FIG. 5]
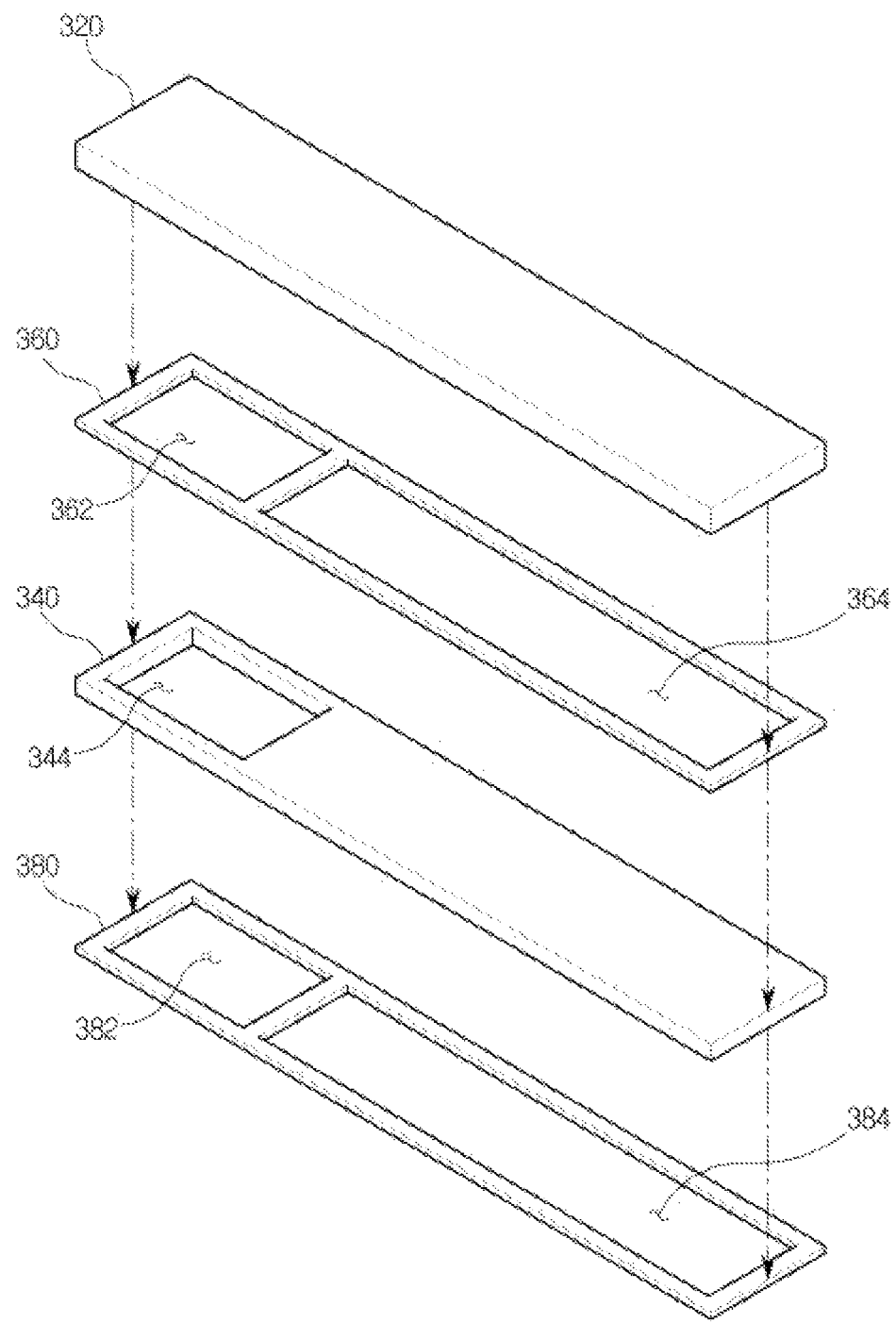

[FIG. 6]
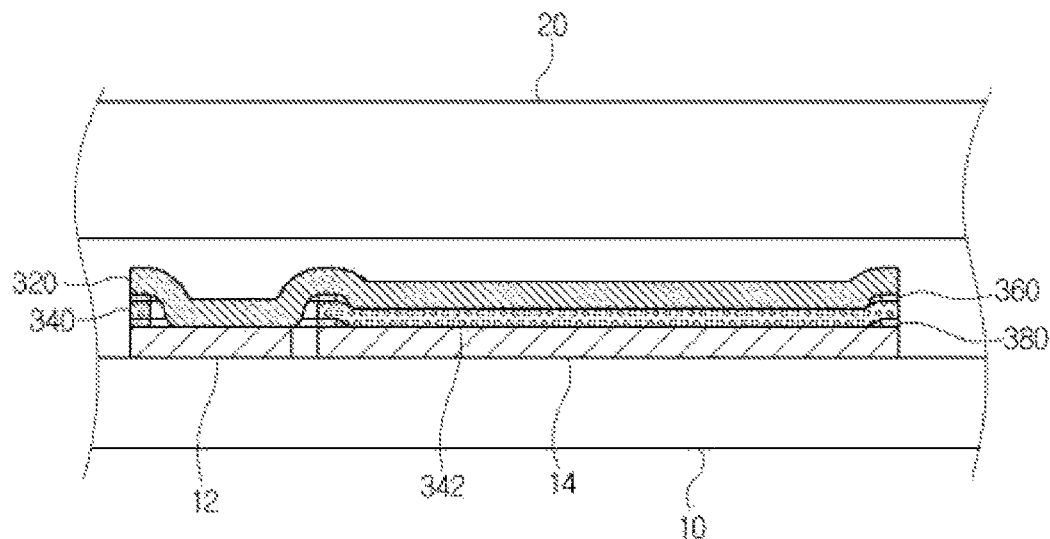
[FIG. 7]
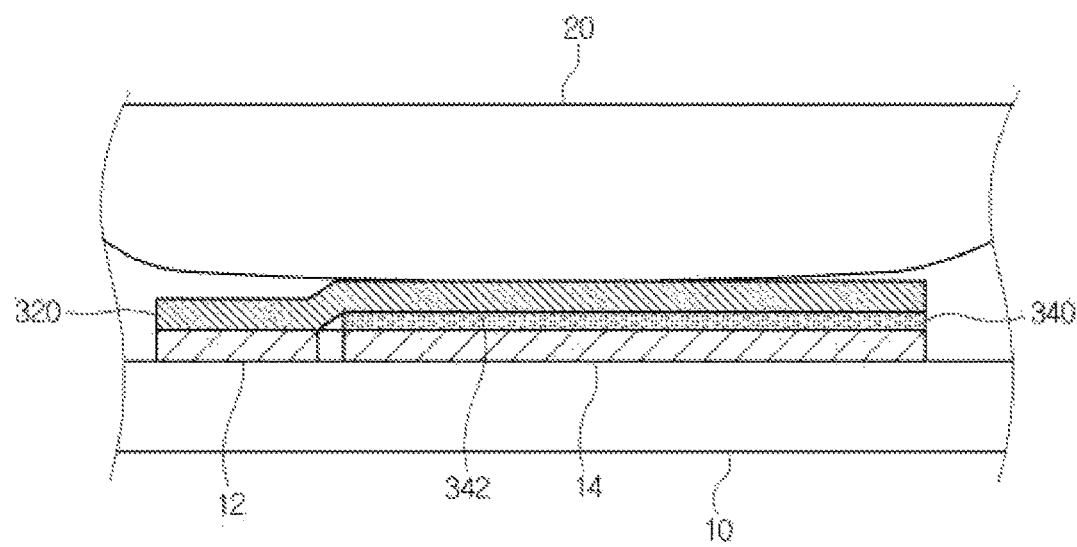

[FIG. 8]
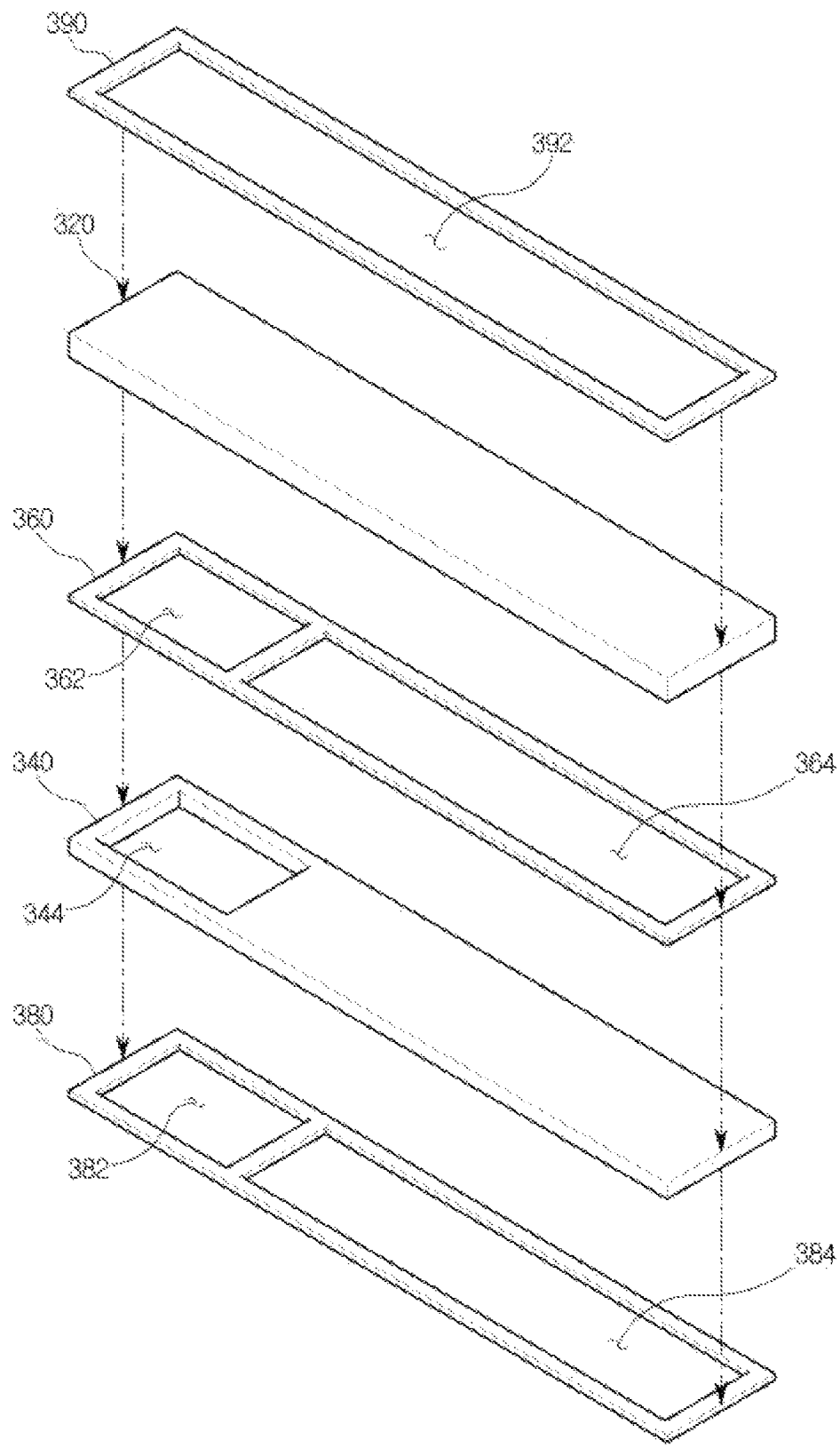

[FIG. 9]
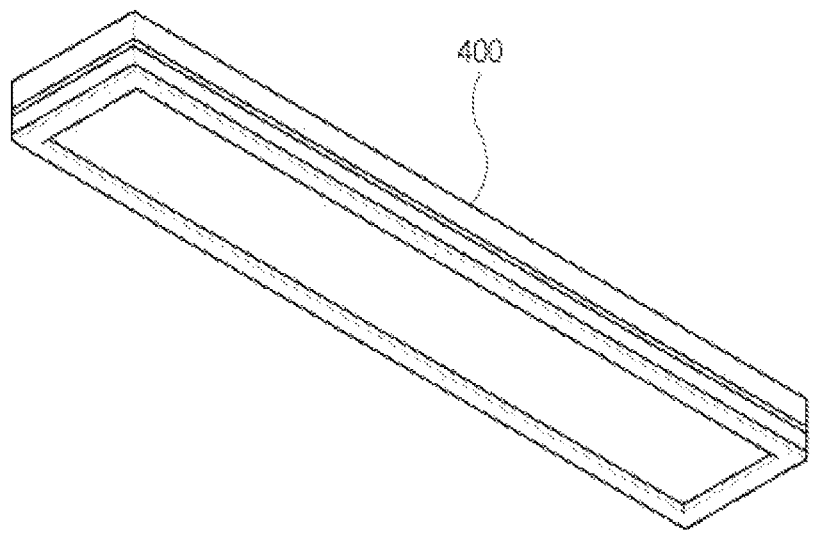

[FIG. 10]
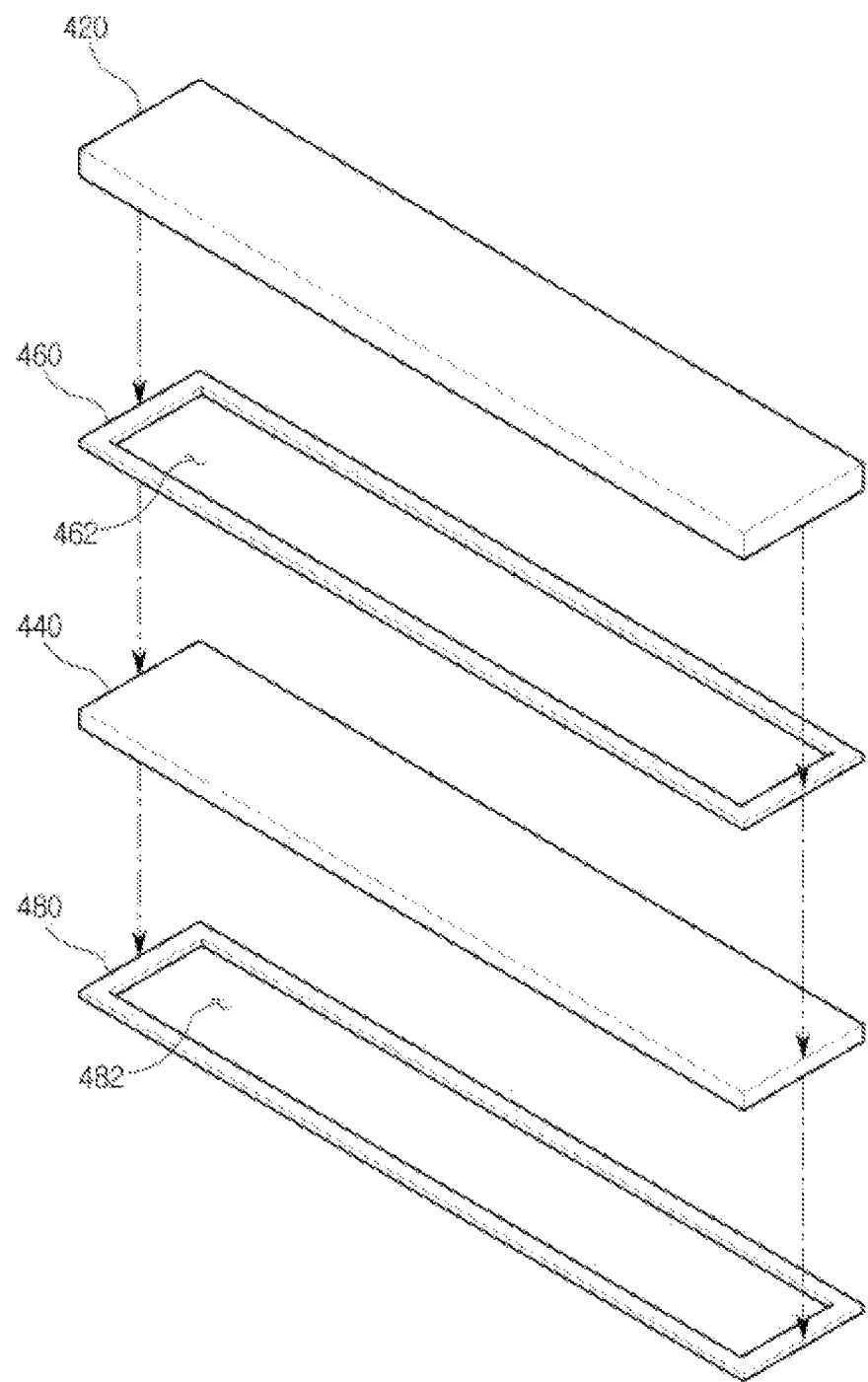

[FIG. 11]
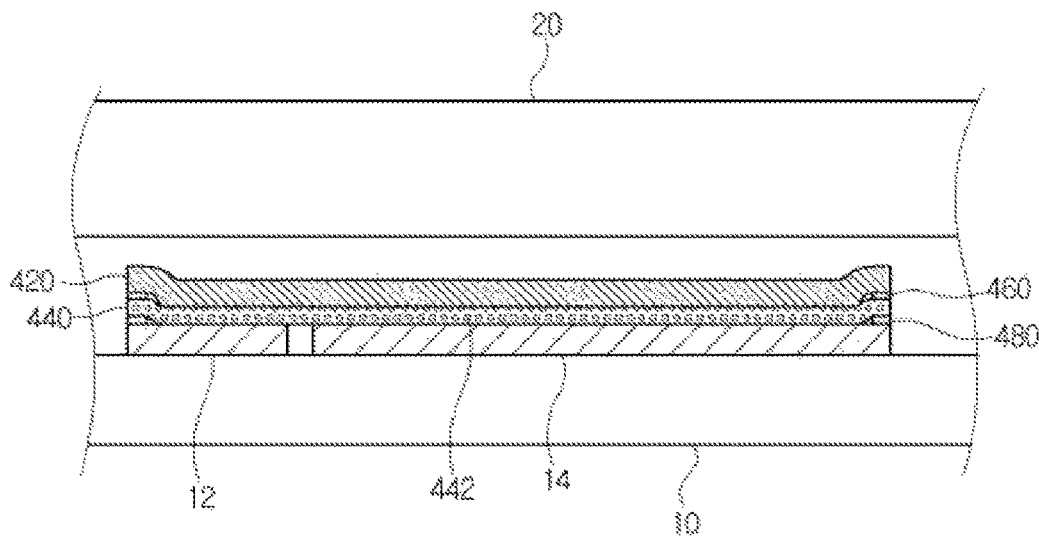
[FIG. 12]
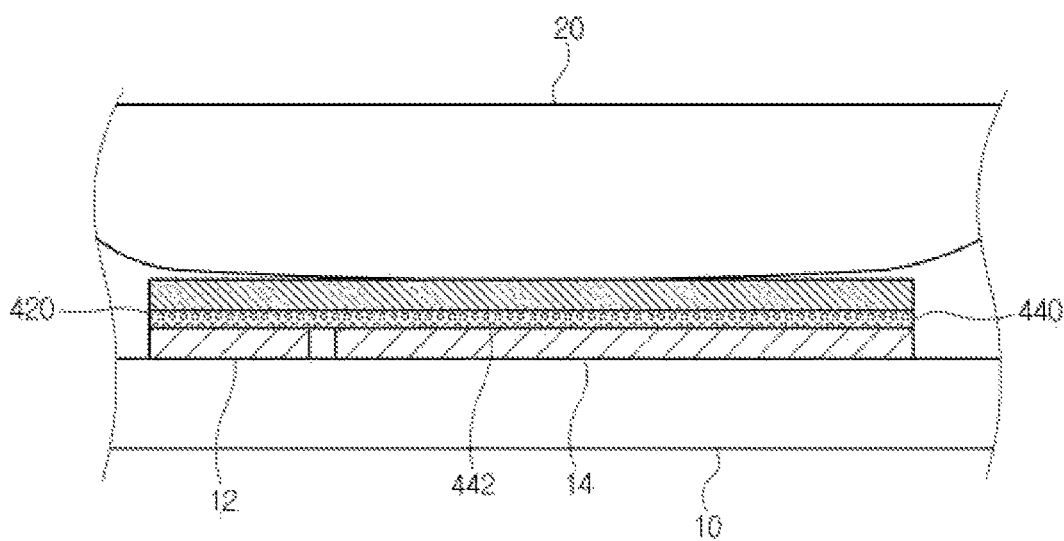

[FIG. 13]
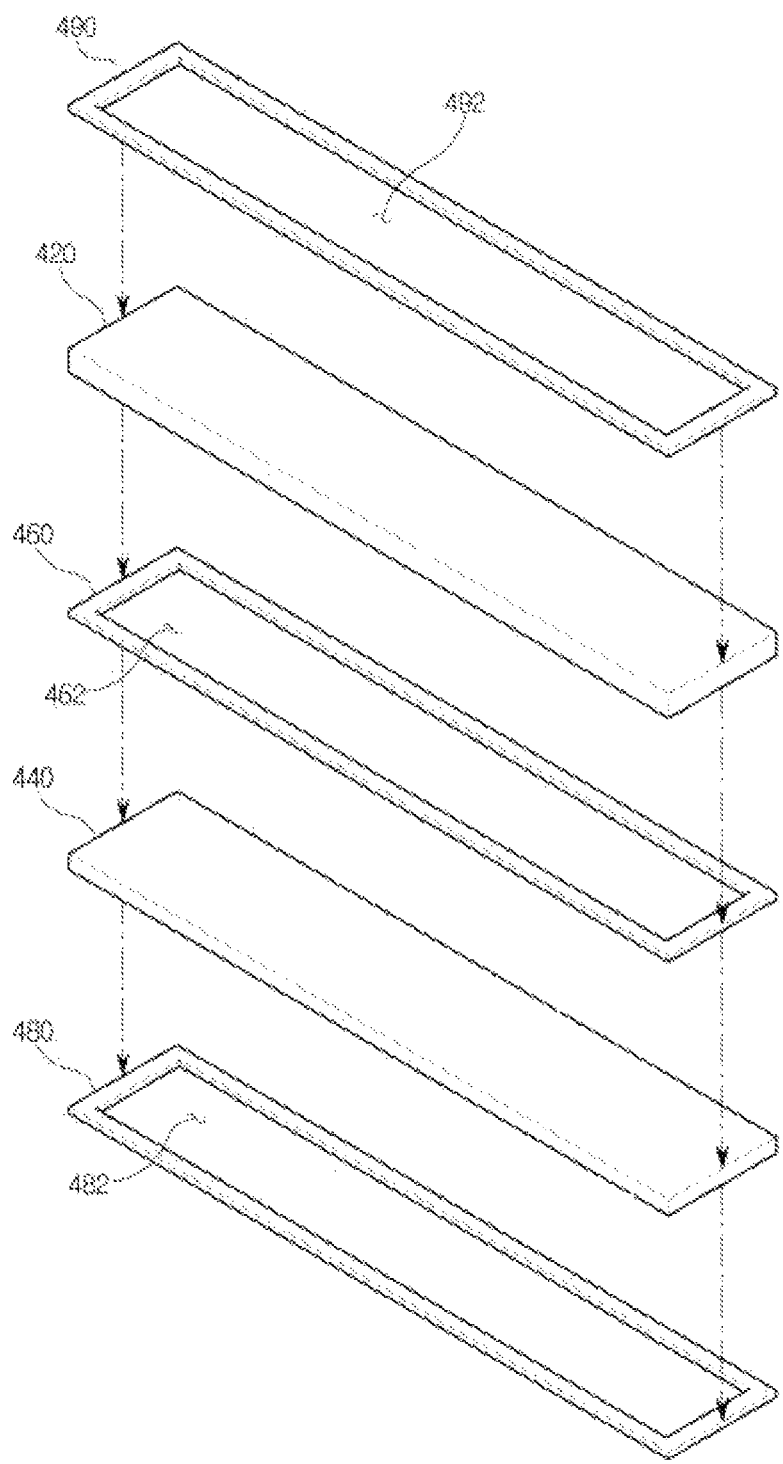

METHOD FOR PRODUCING SENSOR AND BATTERY PRESSURE DETECTING SENSOR PRODUCED THEREBY

TECHNICAL FIELD

The present disclosure relates to a method for producing a sensor and a battery pressure detecting sensor produced thereby, and more specifically, to a method for producing a sensor and a battery pressure detecting sensor produced thereby, which detect a pressure according to swelling of a battery mounted on a portable terminal such as a smart phone or a tablet, or an auxiliary power source device such as an auxiliary battery or a battery pouch.

BACKGROUND ART

A portable terminal is mounted with a battery for supplying a power source. The portable terminal is mainly mounted with a battery using a lithium-based cell.

Swelling occurs in the battery by a gas generated by the reaction of an internal chemical material upon charging operation.

In the portable terminal, ignition, explosion, or the like may occur when an internal temperature increases in a state where the swelling of the battery has occurred.

Recently, as the ignition, explosion, or the like of the battery mounted on the portable terminal frequently occurs, manufacturers are conducting the research on various battery control technologies for preventing the ignition, explosion, or the like of the battery.

As an example, as a representative method among the battery control technologies, there is a charging blocking method according to a battery temperature. The charging blocking method measures the battery temperature or an internal temperature of the portable terminal through a thermistor, and blocks the charging of the battery when the measured temperature is a standard value or more.

However, there frequently occurs a case where the temperature increases to the standard level or more upon charging even in a normal state in the battery. Since a portable terminal to which the charging blocking method is applied determines a normal battery as an abnormal state, there is a problem in that charging and charging blocking are repeated, thereby increasing a charging time of the battery.

Therefore, the producing industry is continuously researching a technology of preventing the ignition, explosion, or the like of the battery while minimizing the increase in the charging time of the battery.

SUMMARY OF INVENTION

Technical Problem

The present disclosure is proposed to solve the above conventional problem, and an object of the present disclosure is to provide a method for producing a sensor and a battery pressure detecting sensor produced thereby, which operate in a short mode when a pressure of a standard level or more is applied, thereby preventing the breakage and ignition of a battery due to swelling.

Solution to Problem

To achieve the object, a battery pressure detecting sensor produced by a method for producing a sensor according to an exemplary embodiment of the present disclosure includes a conductive sheet, and a membrane sheet formed with a first accommodation hole, and disposed under the conductive sheet, in which a part of the conductive sheet passes through the first accommodation hole to be connected to a first terminal, and the membrane sheet is connected to a second terminal.

To achieve the object, a battery pressure detecting sensor according to another exemplary embodiment of the present disclosure may include a membrane sheet having a conductive material whose thickness is changed according to a pressure, in which a lower surface of the membrane sheet is connected to a first terminal and a second terminal of a circuit board. At this time, the battery pressure detecting sensor may further include a conductive sheet disposed above the membrane sheet, and the conductive sheet may include at least one of a conductive tape, a conductive film, and a conductive layer.

To achieve the object, a method for producing a sensor according to an exemplary embodiment of the present disclosure includes preparing a conductive sheet, preparing a membrane sheet formed with a first hole exposing a part of a lower surface of the conductive sheet, laminating the membrane sheet under the conductive sheet, and generating a sensor by perforating a laminate having the conductive sheet and the membrane sheet laminated.

Advantageous Effects of Invention

According to the present disclosure, the method for producing the sensor and the battery pressure detecting sensor produced thereby may operate in the short mode when the pressure exceeding the standard level is applied, thereby detecting the excessive expansion pressure (i.e., the swelling) due to the abnormality of the battery upon charging or discharging of the lithium-ion battery.

Further, the method for producing the sensor and the battery pressure detecting sensor produced thereby may detect the excessive expansion pressure due to the abnormality of the battery, thereby preventing the secondary accident such as failure or explosion due to the swelling of the battery to enable the stable use of the portable terminal.

BRIEF DESCRIPTION OF DRAWINGS

FIGS. 1 to 3 are diagrams for explaining a method for producing a sensor according to an exemplary embodiment of the present disclosure.

FIGS. 4 to 8 are diagrams for explaining a battery pressure detecting sensor according to a first exemplary embodiment of the present disclosure.

FIGS. 9 to 13 are diagrams for explaining a battery pressure detecting sensor according to a second exemplary embodiment of the present disclosure.

DESCRIPTION OF EMBODIMENTS

Hereinafter, the most preferred exemplary embodiments of the present disclosure will be described with reference to the accompanying drawings in order to specifically describe the exemplary embodiments such that those skilled in the art to which the present disclosure pertains may easily implement the technical spirit of the present disclosure. First, in adding reference numerals to the components of each drawing, it should be noted that the same components have the same reference numerals as much as possible even if they are illustrated in different drawings. Further, in describing the present disclosure, when it is determined that the detailed description of the related well-known configuration or function may obscure the gist of the present disclosure, the detailed description thereof will be omitted.

Referring to FIGS. 1 and 2, a method for producing a sensor according to an exemplary embodiment of the present disclosure includes preparing a conductive sheet (S100), preparing a membrane sheet (S200), preparing an adhesive sheet (S300), laminating (S400), and generating a sensor (S500).

The preparing of the conductive sheet (S100) prepares a conductive sheet 120 including a conductive film 122. The preparing of the conductive sheet (S100) prepares the conductive sheet 120 including the conductive film 122 such as a conductive tape or a conductive film (layer). The preparing of the conductive sheet (S100) prepares the conductive sheet 120 having a conductive layer 124 laminated on a lower surface of the conductive film 122 and a remover 126 laminated on an upper surface thereof. As an example, the preparing of the conductive sheet (S100) prepares the conductive sheet 120 including the conductive film 122 having the thickness of about 30 um.

The preparing of the membrane sheet (S200) prepares a membrane sheet 140 having elasticity and conductivity. The preparing of the membrane sheet (S200) prepares the membrane sheet 140 having a base film 144 laminated on an upper surface of the membrane film 142. As an example, the preparing of the membrane sheet (S200) prepares the membrane sheet 140 including the membrane film 142 having the thickness of about 20 um.

The preparing of the membrane sheet (S200) prepares the membrane sheet 140 including the membrane film 142 operating in a short mode as a pressure is applied. As an example, the preparing of the membrane sheet (S200) prepares the membrane sheet 140 including the electrically conductive membrane film 142 formed by electrospinning a conductive powder or a conductive ball together with a conductive nanoweb. Here, the conductive ball is a sphere body having a metal coated on a surface of a non-metal material. The entire conductive ball has an internal layer made of a non-metal material such as polymer or resin, and an external layer made of a metal material. The conductive ball has a lower specific gravity than that of a metal ball entirely formed with a metal and thus is well mixed in the nanoweb solution, thereby enabling the even radiation upon electrospinning.

The preparing of the membrane sheet (S200) prepares the membrane sheet 140 formed with one or more holes. As an example, the preparing of the membrane sheet (S200) prepares the membrane sheet 140 formed with a first hole 146 for exposing a part of the conductive sheet 120.

The preparing of the adhesive sheet (S300) prepares an adhesive sheet 160 having a carrier film 163, an adhesive film 161, and a cover film 165 laminated. The carrier film 163 is laminated on an upper surface of the adhesive film 161. The cover film 165 is laminated on a lower surface of the adhesive film 161.

The preparing of the adhesive sheet (S300) prepares the adhesive sheet 160 having one or more holes perforated. The preparing of the adhesive sheet (S300) prepares the adhesive sheet 160 (a first adhesive sheet 160a and a second adhesive sheet 160b) formed with a second hole 167 exposing a part of the conductive sheet 120 and a third hole 169 exposing a part of the membrane sheet 140. At this time, at least a part of the second hole 167 overlaps with the first hole 146 formed in the membrane sheet 140, and the second hole 167 and the third hole 169 are spaced apart from each other by a predetermined interval.

The preparing of the adhesive sheet (S300) prepares the first adhesive sheet 160a and the second adhesive sheet 160b. The first adhesive sheet 160a is the adhesive sheet 160 used for bonding the membrane sheet 140 and the conductive sheet 120. The second adhesive sheet 160b is the adhesive sheet 160 for bonding a completed sensor 180 to a circuit board 10 disposed adjacent to a battery 20.

The laminating (S400) forms a laminate 170 by laminating the first adhesive sheet 160a, the membrane sheet 140, the second adhesive sheet 160b, and the conductive sheet 120. The laminating (S400) forms the laminate 170 by interposing the first adhesive sheet 160a between an upper surface of the membrane sheet 140 and a lower surface of the conductive sheet 120 to bond the membrane sheet 140 and the conductive sheet 120, and bonding the second adhesive sheet 160b on a lower surface of the membrane sheet 140.

The laminating (S400) bonds the conductive sheet 120 after removing the cover film 165 of the first adhesive sheet 160a. The laminating (S400) bonds the membrane sheet 140 after removing the carrier film 163 of the first adhesive sheet 160a. The laminating (S400) bonds the second adhesive sheet 160b and the membrane sheet 140 after removing the base film 144 of the membrane sheet 140 and the cover film 165 of the second adhesive sheet 160b.

Therefore, the laminating (S400) forms the laminate 170 in which the conductive sheet 120, the first adhesive sheet 160a under the conductive sheet 120, the membrane sheet 140 under the first adhesive sheet 160a, and the second adhesive sheet 160b under the membrane sheet 140 are sequentially disposed.

Meanwhile, referring to FIG. 3, to easily perform the step (S400), the steps (S100 to S300) may also prepare the sheets (the membrane sheet 140, the conductive sheet 120, and the adhesive sheet 160) formed with a guide hole 190, respectively. The step (S400) may easily perform the alignment and lamination of the sheets by inserting a guide pin 220 formed on a jig 200 into the guide hole 190 formed in the sheets.

The generating of the sensor (S500) punches the laminate 170. The generating of the sensor (S500) punches the laminate 170 in various shapes according to a shape required by the sensor 180. At this time, the generating of the sensor (S500) punches the laminate 170 to include the second hole 167 and the third hole 169.

The generating of the sensor (S500) generates the sensor 180 by separating the punched area from the laminate 170. That is, the generating of the sensor (S500) generates the sensor 180 by removing (separating) the punched area from the remover film 126 (the remover 126 included in the conductive sheet 120) disposed on an uppermost portion of the laminate 170.

The generated sensor 180 is attached to upper portions of two terminals of the circuit board 10 after the carrier film 163 is removed. In the sensor 180, a part of the conductive sheet 120 exposed through the first hole 146 and the second hole 167 contacts a first terminal 12 formed on the circuit board 10, and a part of the membrane sheet 140 exposed through the third hole 169 contacts a second terminal 14 formed on the circuit board 10.

Here, FIG. 2 illustrates that a part of the conductive film 122 exposed through the first hole 146 and the second hole 167 is spaced apart from a lowermost portion of the sensor 180, and a part of the membrane film 142 exposed through the third hole 169 is spaced apart from the lowermost portion of the sensor 180.

However, in a real producing process, the conductive film 122 is accommodated inside the first hole 146 and the second hole 167 and the membrane film 142 is accommodated inside the third hole 169 by a pressure applied in a process of bonding the membrane sheet 140, the conductive sheet 120, and the adhesive sheet 160.

Therefore, a part of the conductive film 122 accommodated in the first hole 146 and the second hole 167 is exposed downward from the sensor 180 to be connected to the first terminal 12 of the circuit board 10, and a part of the membrane film 142 accommodated in the third hole 169 is exposed downward from the sensor 180 to be connected to the second terminal 14 of the circuit board 10.

When a pressure exceeding a standard level is applied, the membrane film 142 connected to (contacting) other terminals of the circuit board 10 forms a very low resistance due to the internal conductive balls coupled to each other. The sensor 180 operates in a short mode as the membrane film 142 forms a very low resistance.

Meanwhile, the method for producing the sensor may further include laminating a filter sheet. The filter sheet is laminated on one side surface of the sensor 180 facing the battery 20 to filter swelling occurring upon charging or discharging of the battery 20.

Referring to FIGS. 4 to 6, a battery pressure detecting sensor 300 according to a first exemplary embodiment of the present disclosure is configured to include a conductive sheet 320, a membrane sheet 340, a first adhesive sheet 360, and a second adhesive sheet 380.

The conductive sheet 320 is formed of a conductive film. As an example, the conductive sheet 320 is formed of a conductive film having the thickness of about 30 um, and the conductive film is one of a conductive tape and a conductive film (layer).

The membrane sheet 340 is disposed under the conductive sheet 320. The membrane sheet 340 is formed of a membrane film having elasticity and conductivity. As an example, the membrane sheet 340 is formed to have the thickness of about 20 um. At this time, the membrane sheet 340 is formed with a first accommodation hole 344 accommodating a part of the conductive sheet 320.

The membrane sheet 340 has a conductive body distributed and disposed therein, and may be made of a conductive material formed with a plurality of pores. The membrane sheet 340 includes a conductive material whose thickness may be changed by the pressure applied by the swelling of the battery 20. As an example, the membrane sheet 340 is an electrically conductive membrane film formed by electrospinning a conductive powder or a conductive ball 342 together with a conductive nanoweb.

Here, the conductive ball 342 is a sphere body having a metal coated on a surface of a non-metal material. The entire conductive ball 342 has an internal layer made of a non-metal material such as polymer or resin, and an external layer made of a metal material. The conductive ball 342 has a lower specific gravity than that of a metal ball entirely made of a metal and thus is well mixed in the nanoweb solution, thereby enabling the even radiation upon electrospinning.

The membrane sheet 340 has a conductive body distributed and disposed therein, and may also be made of a conductive material not formed with pores. To form the membrane sheet 340 to have a relatively thin thickness, the membrane sheet 340 may be formed of a non-porous inorganic material sheet. As an example, the membrane sheet 340 may be a urethan film having a conductive member, such as a silver nano wire or a silver particle, distributed and disposed.

The membrane sheet 340 operate in the short mode as the pressure by the swelling of the battery 20 is applied. When the swelling of the battery 20 exceeds a standard level, the conductive powders or the conductive balls 342 positioned inside the electrically conductive membrane are coupled to each other. The membrane sheet 340 operates in the short mode by forming a very low resistance as the conductive materials (the conductive powder or the conductive ball 342) are coupled.

The first adhesive sheet 360 is interposed between the conductive sheet 320 and the membrane sheet 340 to bond the conductive sheet 320 and the membrane sheet 340. An upper surface of the first adhesive sheet 360 is bonded to a lower surface of the conductive sheet 320. A lower surface of the first adhesive sheet 360 is bonded to an upper surface of the membrane sheet 340. As an example, the first adhesive sheet 360 is made of an inorganic material, and formed of a double-sided adhesive film having the thickness of about 5 um.

The first adhesive sheet 360 is formed with a second accommodation hole 362 accommodating a part of the conductive sheet 320. At this time, at least a part of the second accommodation hole 362 overlaps with the first accommodation hole 344 of the membrane sheet 340.

The first adhesive sheet 360 is formed with a third accommodation hole 364 accommodating the other part of the conductive sheet 320. At this time, the other part of the conductive sheet 320 extends downward through the third accommodation hole 364 to be connected to the membrane sheet 340. Here, the connection means a state where a part of the conductive sheet 320 and a part of the membrane sheet 340 contact and are electrically connected to each other.

The second adhesive sheet 380 is bonded to the lower surface of the membrane sheet 340. An upper surface of the second adhesive sheet 380 is bonded to the lower surface of the membrane sheet 340. As an example, the second adhesive sheet 380 is made of an inorganic material, and formed of a double-sided adhesive film having the thickness of about 5 um.

The second adhesive sheet 380 is formed with a fourth accommodation hole 382 accommodating a part of the conductive sheet 320. At this time, at least a part of the fourth accommodation hole 382 overlaps with the first accommodation hole 344 of the membrane sheet 340 and the second accommodation hole 362 of the first adhesive sheet 360. At this time, a part of the conductive sheet 320 extends downward through the first accommodation hole 344 of the membrane sheet 340, the second accommodation hole 362 of the first adhesive sheet 360, and the fourth accommodation hole 382 of the second adhesive sheet 380 to be connected to the first terminal 12 of the circuit board 10. Here, the connection means a state where the conductive sheet 320 and the first terminal 12 contact and are electrically connected to each other.

The second adhesive sheet 380 is formed with a fifth accommodation hole 384 accommodating the other part of the membrane sheet 340. At this time, the other part of the conductive sheet 320 extends downward through the fifth accommodation hole 384 to be connected to the second terminal 14 of the circuit board 10. Here, the connection means a state where the membrane sheet 340 and the second terminal 14 contact and are electrically connected to each other.

At this time, the first accommodation hole 344, the second accommodation hole 362, and the fourth accommodation hole 382 may form voids between the first terminal 12 and the conductive sheet 320, the third accommodation hole 364 may form the void between the conductive sheet 320 and the membrane sheet 340, and the fifth accommodation hole 384 may form the void between the second terminal 14 and the membrane sheet 340.

As a result, the battery pressure detecting sensor 300 may form the void between the terminals 12, 14, the conductive sheet 320, and the membrane sheet 340, thereby enabling the restoration of the membrane sheet 340 after the operation in the short mode and being re-used.

Meanwhile, the first adhesive sheet 360 and the second adhesive sheet 380 may be formed with grooves forming an air passage through a cut-line process or the like to discharge the air flowing into the void in the producing process to the outside. As a result, the battery pressure detecting sensor 300 may be easily produced while minimizing defects.

As illustrated in FIG. 7, the battery pressure detecting sensor 300 according to the first exemplary embodiment of the present disclosure has a part of the conductive film connected to (contacting) the first terminal 12, and a part of the membrane film connected to (contacting) the second terminal 14. That is, the battery pressure detecting sensor 300 has a part of the conductive sheet 320 contacting the first terminal 12 to be electrically connected thereto, and a part of the membrane sheet 340 contacting the second terminal 14 to be electrically connected thereto.

If the swelling of the battery 20 is within a normal range, a pressure of the standard level or less is applied to the battery pressure detecting sensor 300. If the pressure of the standard level or less is applied to the battery pressure detecting sensor 300, the conductive balls 342 inside the membrane sheet 340 are not coupled to each other, thereby not causing a change in resistance.

Therefore, the battery pressure detecting sensor 300 has an electrical path formed between the first terminal 12, the conductive sheet 320, the membrane sheet 340, and the second terminal 14 to operate in a normal mode.

If the swelling of the battery 20 exceeds the normal range, a pressure exceeding the standard level is applied to the battery pressure detecting sensor 300. If the pressure exceeding the standard level is applied to the battery pressure detecting sensor 300, the conductive balls 342 inside the membrane sheet 340 are coupled to each other to form a very low resistance.

Therefore, the battery pressure detecting sensor 300 operates in the short mode in which the electrical path between the first terminal 12 and the second terminal 14 is blocked.

Meanwhile, the swelling occurs in a certain portion of the battery 20 in an aluminum pouch cell type by itself upon charging or discharging. As an example, the swelling of about 30% occurs in the battery 20 in the aluminum pouch cell type upon charging or discharging. If the aforementioned battery pressure detecting sensor 300 is applied to the battery 20 in the aluminum pouch cell type, the swelling occurring upon charging or discharging is detected as the swelling due to the generation of a gas inside the battery 20, such that charging or discharging may be restricted. Therefore, there is the need for a structure for filtering the swelling occurring upon charging or discharging and detecting only the swelling due to the generation of the gas.

Referring to FIG. 8, the battery pressure detecting sensor 300 may further include a filter sheet 390 disposed above the conductive sheet 320 to filter the swelling occurring upon charging or discharging.

The filter sheet 390 is disposed between the conductive sheet 320 and the battery 20. The filter sheet 390 is formed in a frame shape. That is, the filter sheet 390 is formed with a hole 392 in a predetermined shape, and formed of a plate shape, which is a hard material. The hole 392 forms a void between the conductive sheet 320 and the battery 20. The filter sheet 390 is made of a hard material with the strength of a certain level or more. As an example, the filter sheet 390 is a PET, which is a hard material.

The swelling occurring upon charging or discharging occurs evenly on an entire surface of the battery 20. At this time, the battery pressure detecting sensor 300 is pressed by the swelling occurring upon charging or discharging, but the filter sheet 390 distributes the pressure, such that the pressure is not applied to the membrane sheet 340. Therefore, the membrane sheet 340 does not operate in the short mode, such that the occurrence of the swelling of the battery 20 is not detected.

On the other hand, the swelling occurring due to the gas occurs on a specific portion of the battery 20 (mainly, the center of the battery 20). At this time, the swelling of the battery 20 concentrates on the void formed by the filter sheet 390, such that the pressure is applied to the membrane sheet 340. Therefore, the membrane sheet 340 operates in the short mode, such that the occurrence of the swelling of the battery 20 is detected.

Referring to FIGS. 9 to 11, a battery pressure detecting sensor 400 according to a second exemplary embodiment of the present disclosure is configured to include a conductive sheet 420, a membrane sheet 440, a first adhesive sheet 460, and a second adhesive sheet 480.

The conductive sheet 420 is formed of a conductive film. As an example, the conductive sheet 420 is formed of a conductive film having the thickness of about 30 um, and the conductive film is one of a conductive tape and a conductive film (layer).

The membrane sheet 440 is disposed under the conductive sheet 420. The membrane sheet 440 is formed of a membrane film having elasticity and conductivity. As an example, the membrane sheet 440 is formed to have the thickness of about 20 um.

The membrane sheet 440 may have a conductive body distributed and disposed therein, and be made of a conductive material formed with a plurality of pores. The membrane sheet 440 includes the conductive material whose thickness may be changed by a pressure applied by the swelling of the battery 20. As an example, the membrane sheet 440 is an electrically conductive membrane film formed by electrospinning a conductive powder or a conductive ball 442 together with a conductive nanoweb.

Here, the conductive ball 442 is a sphere body having a metal coated on a surface of a non-metal material. The entire conductive ball 442 has an internal layer made of a non-metal material such as polymer or resin, and an external layer made of a metal material. The conductive ball 442 has a lower specific gravity than that of a metal ball entirely made of a metal and thus is well mixed in the nanoweb solution, thereby enabling the even radiation upon electrospinning.

The membrane sheet 440 has the conductive body distributed and disposed therein, and may also be made of a conductive material not formed with pores. To form the membrane sheet 440 to have a relatively thin thickness, the membrane sheet 440 may be formed of a non-porous inorganic material sheet. As an example, the membrane sheet 440 may be a urethan film having a conductive member, such as a silver nano wire or a silver particle, distributed and disposed.

The membrane sheet 440 operates in the short mode as the pressure by the swelling of the battery 20 is applied. When the swelling of the battery 20 exceeds the standard level, the conductive powders or the conductive balls 442 positioned inside the electrically conductive membrane film are coupled to each other. As the conductive materials (the conductive powders or the conductive balls 442) are coupled, the membrane sheet 440 forms a very low resistance to operate in the short mode.

The first adhesive sheet 460 is interposed between the conductive sheet 420 and the membrane sheet 440 to bond the conductive sheet 420 and the membrane sheet 440. An upper surface of the first adhesive sheet 460 is bonded to a lower surface of the conductive sheet 420. A lower surface of the first adhesive sheet 460 is bonded to an upper surface of the membrane sheet 440. As an example, the first adhesive sheet 460 is made of an inorganic material, and formed of a double-sided adhesive film having the thickness of about 5 um.

The first adhesive sheet 460 is disposed along the outer circumference of the lower surface of the conductive sheet 420 and formed with a first accommodation hole 462 accommodating a part of the conductive sheet 420. At this time, the conductive sheet 420 extends downward through the first accommodation hole 462 to be connected to the membrane sheet 440. Here, the connection means a state where the conductive sheet 420 and the membrane sheet 440 contact and are electrically connected to each other.

The second adhesive sheet 480 is bonded to the lower surface of the membrane sheet 440. An upper surface of the second adhesive sheet 480 is bonded to a lower surface of the membrane sheet 440. As an example, the second adhesive sheet 480 is made of an inorganic material, and formed of a double-sided adhesive film having the thickness of about 5 um.

The second adhesive sheet 480 is formed with a second accommodation hole 482 accommodating a part of the membrane sheet 440. At this time, the membrane sheet 440 extends downward through the second accommodation hole 482 to be connected to the first terminal 12 and the second terminal 14 of the circuit board 10. Here, the connection means a state where the membrane sheet 440 contacts the first terminal 12 and the second terminal 14 and is electrically connected thereto.

At this time, the first accommodation hole 462 may form a void between the conductive sheet 420 and the membrane sheet 440, and the second accommodation hole 482 may form a void a lower portion of the membrane sheet 440.

As a result, the battery pressure detecting sensor 400 may form the void between the terminals 12, 14, the conductive sheet 420, and the membrane sheet 440, thereby enabling the restoration of the membrane sheet 440 after the operation in the short mode and being re-used.

Meanwhile, the first adhesive sheet 460 and the second adhesive sheet 480 may be formed with grooves forming an air passage through a cut-line process or the like to discharge the air flowing into the void in the producing process to the outside. As a result, the battery pressure detecting sensor 300 may be easily produced while minimizing defects.

As illustrated in FIG. 12, the battery pressure detecting sensor 400 according to the second exemplary embodiment of the present disclosure has a part of the membrane film connected to (contacting) the first terminal 12, and the other part of the membrane film connected to (contacting) the second terminal 14. That is, the membrane sheet 440 contacts the first terminal 12 and the second terminal 14 to be electrically connected to each other.

If the swelling of the battery 20 is within a normal range, a pressure of a standard level or less is applied to the battery pressure detecting sensor 400. If the pressure of the standard level or less is applied to the battery pressure detecting sensor 400, the conductive balls 442 inside the membrane sheet 440 are not coupled to each other, thereby not causing a change in resistance.

Therefore, the battery pressure detecting sensor 400 has an electrical path formed between the first terminal 12, the conductive sheet 420, the membrane sheet 440, and the second terminal 14 to operate in a normal mode.

If the swelling of the battery 20 exceeds the normal range, a pressure exceeding the standard level is applied to the battery pressure detecting sensor 400. If the pressure exceeding the standard level is applied to the battery pressure detecting sensor 400, the conductive balls 442 inside the membrane sheet 440 are coupled to each other to form a very low resistance.

Therefore, the battery pressure detecting sensor 400 operates in the short mode in which the electrical path between the first terminal 12 and the second terminal 14 is blocked.

Referring to FIG. 13, the battery pressure detecting sensor 400 may further include the filter sheet 490 disposed above the conductive sheet 420 to filter the swelling occurring upon charging or discharging.

The filter sheet 490 is disposed between the conductive sheet 420 and the battery 20. The filter sheet 490 is formed in a frame shape. That is, the filter sheet 490 is formed with a hole 492 in a predetermined shape, and formed in a plate shape, which is a hard material. The hole 492 forms a void between the conductive sheet 420 and the battery 20. The filter sheet 490 is made of a hard material having the strength of a certain level or more. As an example, the filter sheet 490 is a PET, which is a hard material.

The swelling occurring upon charging or discharging occurs evenly on an entire surface of the battery 20. At this time, the battery pressure detecting sensor 400 is pressed by the swelling occurring upon charging or discharging, but the filter sheet 490 distributes the pressure, such that the pressure is not applied to the membrane sheet 440. Therefore, the membrane sheet 440 does not operate in the short mode, such that the occurrence of the swelling of the battery 20 is not detected.

On the other hand, the swelling occurring due to the gas occurs on a specific portion of the battery 20 (mainly, the center of the battery 20). At this time, the swelling of the battery 20 concentrates on the void formed by the filter sheet 490, such that the pressure is applied to the membrane sheet 440. Therefore, the membrane sheet 440 operates in the short mode, such that the occurrence of the swelling of the battery 20 is detected.

Although the preferred exemplary embodiments of the present disclosure have been described above, it is understood that the present disclosure may be modified in various forms, and those skilled in the art may practice various modified examples and changed examples without departing from the scope of the claims of the present disclosure.

The invention claimed is:

1. A method for producing a battery pressure detecting sensor comprising:
   preparing a conductive sheet;

preparing a membrane sheet comprising a conductive nanoweb and a conductive ball and formed with a first hole exposing a part of a lower surface of the conductive sheet;

laminating the membrane sheet under the conductive sheet; and generating a sensor by perforating a laminate having the conductive sheet and the membrane sheet laminated.

2. The method for producing the sensor of claim 1, wherein the preparing of the conductive sheet prepares the conductive sheet comprising a conductive film comprising one of a conductive tape, a conductive film, and a conductive layer.

3. The method for producing the sensor of claim 1, wherein the preparing of the membrane sheet prepares the membrane sheet having a conductive material whose thickness is changed according to a pressure.

4. The method for producing the sensor of claim 1, wherein the preparing of the membrane sheet prepares the membrane sheet comprising an electrically conductive membrane film formed by electrospinning the conductive nanoweb and the conductive ball, and wherein the conductive ball is formed by coating a metal on a surface of a non-metal sphere body.

5. The method for producing the sensor of claim 1, further comprising: preparing an adhesive sheet formed with a second hole and a third hole.

6. The method for producing the sensor of claim 5, wherein the preparing of the adhesive sheet prepares a first adhesive sheet and a second adhesive sheet, and wherein the laminating interposes the first adhesive sheet between the conductive sheet and the membrane sheet, and laminates the second adhesive sheet under the membrane sheet.

7. The method for producing the sensor of claim 6, wherein the second holes of the first adhesive sheet and the second adhesive sheet overlap with the first hole to expose a part of the conductive sheet, the lower surface of the conductive sheet exposed through the third hole of the first adhesive sheet is connected to an upper surface of the membrane sheet, and the third hole of the second adhesive sheet exposes a part of a lower surface of the membrane sheet.

8. The method for producing the sensor of claim 1, wherein the preparing of the conductive sheet prepares the conductive sheet formed with a guide hole through which a guide pin of a jig penetrates, and wherein the preparing of the membrane sheet prepares the membrane sheet formed with the guide hole through which the guide pin penetrates.

9. A battery pressure detecting sensor comprising:
a conductive sheet; and
a membrane sheet comprising a conductive nanoweb and conductive ball and formed with a first accommodation hole, and disposed under the conductive sheet,
wherein a part of the conductive sheet passes through the first accommodation hole to be connected to a first terminal, and the membrane sheet is connected to a second terminal.

10. The battery pressure detecting sensor of claim 9, wherein the membrane sheet comprises: an electrically conductive membrane film formed by electrospinning the conductive nanoweb and the conductive ball, and the conductive ball is formed by coating a metal on a surface of a non-metal sphere body.

11. The battery pressure detecting sensor of claim 9, further comprising: a first adhesive sheet formed with a second accommodation hole and a third accommodation hole, and interposed between the conductive sheet and the membrane sheet, wherein the second accommodation hole overlaps with the first accommodation hole, and the third accommodation hole is spaced apart from the second accommodation hole.

12. The battery pressure detecting sensor of claim 11, further comprising: a second adhesive sheet formed with a fourth accommodation hole and a fifth accommodation hole, and disposed under the membrane sheet, wherein the fourth accommodation hole overlaps with the first accommodation hole and the second accommodation hole, and the fifth accommodation hole is spaced apart from the fourth accommodation hole.

13. The battery pressure detecting sensor of claim 12, wherein a lower surface of the conductive sheet exposed through the first accommodation hole, the second accommodation hole, and the fourth accommodation hole is connected to the first terminal, and wherein a lower surface of the membrane sheet exposed through the fifth accommodation hole is connected to the second terminal.

14. The battery pressure detecting sensor of claim 9, further comprising:
a filter sheet disposed above the conductive sheet.

15. A battery pressure detecting sensor comprising:
a membrane sheet having a conductive material whose thickness is changed according to a pressure,
wherein the conductive material includes a conductive nanoweb and a conductive ball, and
wherein a lower surface of the membrane sheet is connected to a first terminal and a second terminal of a circuit board.

16. The battery pressure detecting sensor of claim 15, wherein the membrane sheet comprises: an electrically conductive membrane film formed by electrospinning the conductive nanoweb and the conductive ball, and wherein the conductive ball is formed by coating a metal on a surface of a non-metal sphere body.

17. The battery pressure detecting sensor of claim 15, further comprising: an adhesive sheet formed with an accommodation hole, and disposed under the membrane sheet, wherein a lower surface of the membrane sheet exposed through the accommodation hole is connected to the first terminal and the second terminal.

18. The battery pressure detecting sensor of claim 15, further comprising: a conductive sheet disposed above the membrane sheet.

19. The battery pressure detecting sensor of claim 18, further comprising another adhesive sheet formed with an accommodation hole, and interposed between the conductive sheet and the membrane sheet, wherein a lower surface of the conductive sheet exposed through the accommodation hole is connected to the membrane sheet.

20. The battery pressure detecting sensor of claim 15, further comprising: a filter sheet disposed above the membrane sheet.

* * * * *